(12) United States Patent
Nariyama

(10) Patent No.: US 6,418,028 B2
(45) Date of Patent: Jul. 9, 2002

(54) REINFORCING STRUCTURE FOR A PRINTED CIRCUIT BOARD

(75) Inventor: Satoshi Nariyama, Saitama (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/789,854

(22) Filed: Feb. 21, 2001

(30) Foreign Application Priority Data

Feb. 22, 2000 (JP) ........................................ 2000-044061

(51) Int. Cl.⁷ ................................................ H05K 7/14
(52) U.S. Cl. ........................ 361/759; 753/756; 753/801; 753/802; 211/41.17
(58) Field of Search ................................ 361/759, 801, 361/802, 726–727; 211/41.17; 403/24; 312/223.1

(56) References Cited

U.S. PATENT DOCUMENTS

| 4,717,216 A | * | 1/1988 | Hornak | .................... 211/41.17 |
| 4,739,452 A | * | 4/1988 | Fukunaga | .................... 361/756 |
| 4,988,577 A | | 1/1991 | Jamieson | |
| 5,378,545 A | | 1/1995 | Akulow | |
| 6,166,917 A | * | 12/2000 | Anderson | .................... 361/756 |

FOREIGN PATENT DOCUMENTS

| JP | 5-63379 | 3/1993 |
| JP | 11-214806 | 8/1999 |

* cited by examiner

Primary Examiner—Jayprakash N. Gandhi
(74) Attorney, Agent, or Firm—Hayes Soloway P.C.

(57) ABSTRACT

A structure for reinforcing a printed circuit board in a low cost preventing failures such as solder cracks and lands stripped off the printed circuit board is disclosed. The printed circuit board having a rectangular shape is mounted with electronic components. On the inner wall surfaces of a housing, a plurality of pillar-shaped supports are formed so as to protrude at predetermined positions. Both edges of the printed circuit board in a longitudinal direction are fitted into respective ones of grooves formed in a pair of reinforcing members. Each reinforcing member has a rib integrally formed in a direction perpendicular to the opening direction of the groove. The reinforcing members are fixed by screws to the respective ones of the supports.

14 Claims, 7 Drawing Sheets

13　20　11　15　12　20　21

33  40  31  35  32  40 41 46

133 140 131 135 132 141 146

REINFORCING STRUCTURE FOR A PRINTED CIRCUIT BOARD

BACKGROUND OF THE INVENTION

1. Field of the Invention

The present invention relates to a reinforcing structure of a printed circuit board and in particular to a electronic apparatus with a reinforcing structure for sustaining stress applied to a connection of a printed circuit board to electronic components mounted on the above printed circuit board by sustaining flexure of the above printed circuit board attached within a housing.

2. Description of the Related Art

There have been proposed and commercially available various kinds of electronic apparatuses with a printed circuit board fixed in a housing thereof, the printed circuit board having electronic components mounted thereon. In these electronic apparatuses, the printed circuit board is attached to the housing by aligning each threaded hole in the board respectively with a threaded hole in a pillar-shaped support member provided at each predetermined position on the inner surface of the housing and fixing them together with a screw. Therefore, when a small electronic apparatus such as a portable equipment having a housing made of molded plastics is dropped or a person sits down on the equipment put in a pocket of the trousers and the housing is deformed, stress directly acts on the printed circuit board inside to cause a bend in the above printed circuit board, the stress concentrating on soldered portions of the electronic components mounted on the above printed circuit board. Consequently, problems occur such as solder cracks, lands stripped off the printed circuit board or other failures. Such a failure often occurs in a component of a relatively large size and having a connection on its back side to a printed circuit board through solder bumps, such as BGA (Ball Grid Array) and CSP (Chip Size Package) in particular.

Conventionally, to prevent the failures mentioned above, a structure as shown in FIGS. 12 and 13 is employed. FIG. 12 is a perspective view showing the state in which printed circuit board 1 having electronic components 5 such as BGA-type bonded thereto with thermosetting resin 6 is attached to housing 2. FIG. 13 is a cross sectional view showing bonded portions with thermosetting resin 6.

Each of electronic components 5 has been bonded to a printed circuit board 1 by a thermosetting resin 6. By this, each electronic component 5 and its contact portions composed of lands 7 and solder bumps 8 are fixed to the printed circuit board 1, and protected from the failure due to the concentrated stress. For example, bonding with thermosetting resin 6 is performed by placing electronic components such as BGA-type on the printed circuit board and then applying a thermosetting resin such as epoxy resin around the electronic components and heating them.

Another approach to preventing the failure mentioned above is to employ a reinforcing structure as described in Japanese Patent Application Unexamined Publication No. 11-214806. This reinforcing structure is a structure to be attached to the housing with metallic reinforcing members respectively mounted along the both sides of the printed circuit board.

The conventional approach by which electronic components are bonded to the printed circuit board with a thermosetting resin has a problem that manufacturing cost becomes higher because it is necessary to provide equipment dedicated to applying and heating the thermosetting resin. In addition, when a defect is found in an electronic component after bonding to the printed circuit board, the electronic component concerned cannot be replaced solely, so the printed circuit board having the electronic components mounted thereon will be discarded. Consequently, a problem occurs that manufacturing yield is lowered and manufacturing cost becomes high.

In the reinforcing structure according to the Japanese Patent Application Unexamined Publication No. 11-214806 in which metallic reinforcing members are respectively bonded to the printed circuit board along the both sides of the printed circuit board, the printed circuit board is attached to the housing at the positions of the reinforcing members, so the metallic reinforcing members should be processed and a problem occurs that processing cost is necessary.

SUMMARY OF THE INVENTION

An object of this invention is to provide a printed circuit board reinforcing structure allowing flexure of the printed circuit board to be suppressed even if the board is thin or long and so flexible, thereby preventing failures such as solder cracks and lands stripped off the printed circuit board.

The above object is accomplished by an arrangement wherein a rod-like reinforcing member elongated along a longitudinal direction is comprised of: a groove into which one of both edges of the printed circuit board is to be fitted; a reinforcing rib which protrudes outwardly at a predetermined angle with respect to an opening direction of the groove portion and extends in a longitudinal direction of the reinforcing member; and a plurality of protrusions provided at positions, each of which corresponds to one of the supports of the housing to be fixed to a corresponding support so as to secure the reinforcing member to the housing.

The reinforcing member may be integrally formed of plastic. The reinforcing rib may protrude outwardly in a direction perpendicular to the opening direction of the groove portion.

The protrusions may be respectively provided on both ends of the reinforcing member in the longitudinal direction, wherein each of the protrusions protrudes in a direction opposite to the opening direction of the groove portion.

The protrusions may be respectively provided on both ends of the reinforcing member in the longitudinal direction, wherein each of the protrusions protrudes in the opening direction of the groove portion and is fixed to the corresponding support by means of a screw together with the edge of the printed circuit board fitted into the groove portion.

Side walls of the groove portion may be elastic and grasp the edge of the printed circuit board fitted into the groove portion by elasticity.

The electronic components may be mounted on the printed circuit board with solder bumps.

DETAILED DESCRIPTION OF THE PREFERRED EMBODIMENTS

Now, embodiments of this invention will be described with reference to the drawings.

First embodiment

Figure 1:
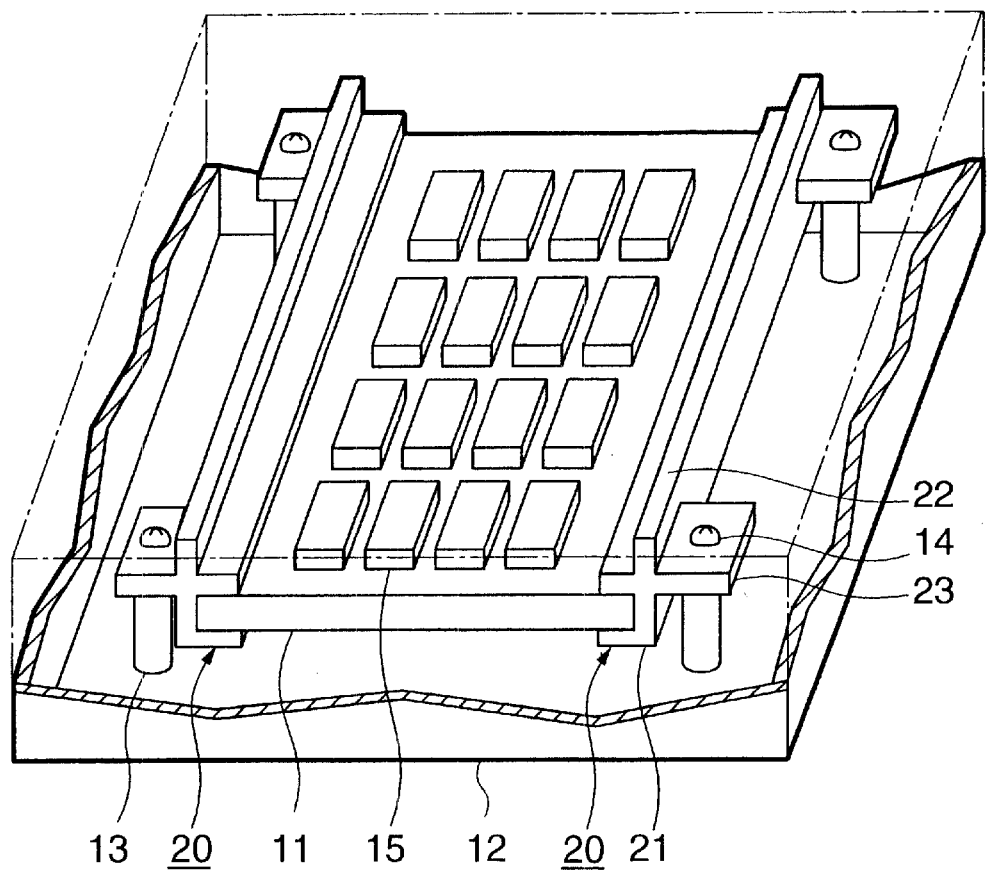
FIG. 1 is a perspective view of a first embodiment of this invention.
Figure 2:
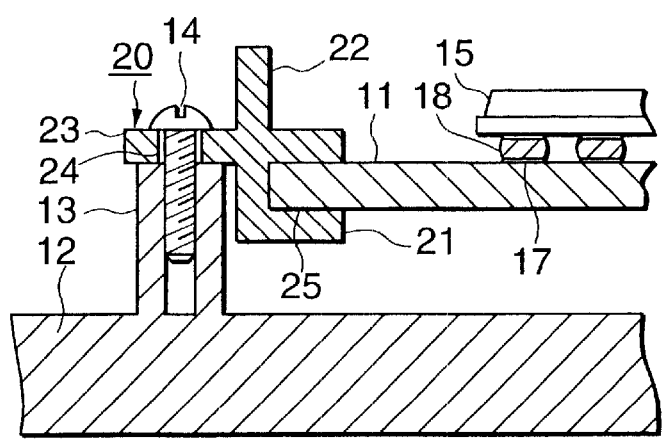
FIG. 2 is a cross sectional view of a main part of FIG. 1.

FIG. 1 is a perspective view showing a printed circuit board 11 mounted inside of a housing 12 through reinforcing members 20, 20 and FIG. 2 is a cross sectional view showing the mounting portion.

Referring to FIGS. 1 and 2, on the printed circuit board 11 which is of a plate form and has a rectangular shape seen from above are mounted a plurality of electronic components 15 (such as BGA or CSP chips). The housing 12 is a molded plastic case and, inside of the housing 12, a plurality of pillar-shaped supports 13 are integrally molded with the housing 12 so as to protrude from the inside surface thereof at predetermined positions, and threaded holes are bored in the end faces of the respective supports 13. On both edges of the printed circuit board 11 on the longer side are fitted the reinforcing members 20, 20 formed of plastic, and the reinforcing members 20, 20 are fixed by screws to the respective supports 13 situated at corresponding positions.

The substrate of the printed circuit board 11 is made of epoxy resin glass, and on its both sides are formed circuit patterns (not shown) of copper foil respectively coated with resist (not shown). At predetermined positions on the substrate are formed lands 17 and through holes (not shown). The electronic components 15 mounted on one side (the upper side in FIG. 1) of the printed circuit board 11 are fixed to the respective lands 17 on the substrate through solder bumps 18.

The reinforcing members 20 are made of ABS (acrylonitrile-butadiene-styrene) resin for example, but not limited to ABS resin or even to any resin. Any material may be used which has required flexure strength. Use of ABS resin has an effect that the required flexural strength can be accomplished even with ribs 22 of a small size, which will be discussed later. Further, use of a resin has an effect that integral molding can be easily accomplished. Each of the reinforcing members 20, 20 has a length the same as that of the corresponding edges of the printed circuit board 11. On the reinforcing members 20 grooves 25 are formed along their longitudinal direction. Into these grooves 25 the longitudinal edges of the printed circuit board 11 are to be fitted. The portions that constitute these grooves will be referred to as fitting portions 21. The portions near the walls that constitute the bottom surfaces of the grooves will be referred to as bases of the grooves.

In the reinforcing members 20, ribs 22 are formed integrally in the longitudinal direction for reinforcement. In the example shown, the ribs 22 are formed so as to protrude vertically upwards from the upper surfaces of the fitting portions 21 (outer faces near the bases of the grooves) but not necessarily vertically. Vertical formation increases the reinforcing effect to loads in a direction vertical to the plane of the printed circuit board 11. It also has an effect that the freedom is increased in a mold opening direction in the case of integral molding of the resin. Ribs 22 may also be formed so as to protrude vertically downwards from the lower surfaces of the fitting portions 21, but not necessarily vertically. Vertical formation has the same effect as with the case in which the ribs 22 are formed vertically on the upper outer surfaces of the fitting portions 21.

On both ends in the longitudinal direction of the reinforcing members 20, protrusions 23 are integrally formed each having a through hole 24 for fixing by screw. Each of the protrusions 23 is formed so as to extend in the direction from the opening side of a corresponding groove 25 to the base thereof. These protrusions 23 are formed in positions above the upper inner surfaces of the grooves into which the printed circuit board 11 is to be fitted, so they have an effect to reduce the height of the printed circuit board 11 from the bottom surface of the housing 12 when the printed circuit board 11 is attached to the housing 12.

The printed circuit board 11 can be attached to the housing 12 by fitting the edges of the printed circuit board 11 into the grooves 25 of the respective reinforcing members 20, then aligning the through holes 24 of the protrusions 23 of the respective reinforcing members 20, 20 with the threaded holes in the supports 13 situated in corresponding positions of the housing 12, and finally fixing them by screws 14.

In the first embodiment, the printed circuit board 11 is protected against deforming loads by the reinforcing members 20, preventing its flexure, so solder cracks and land stripping can be prevented. The realiability of the printed circuit board 11 can also be improved. Further, strength can be ensured by the ribs 22 provided in the longitudinal direction of the reinforcing members 20, so the thickness of the fitting portions 21 can be matched to that of the printed circuit board 11 while maintaining the required flexure strength, therefore the increase in weight by the reinforcing members 20 can be minimized. For various thicknesses and various sizes of the printed circuit board, the flexure of the printed circuit board can be avoided while minimizing the increase in total weight, by properly changing the height of the ribs according to its thickness and size. Further, the reinforcing members 20 can be manufactured at a low cost by cast molding or the like, and reinforcement of the printed circuit board can also be performed at a low cost.

Second Embodiment

Figure 3:
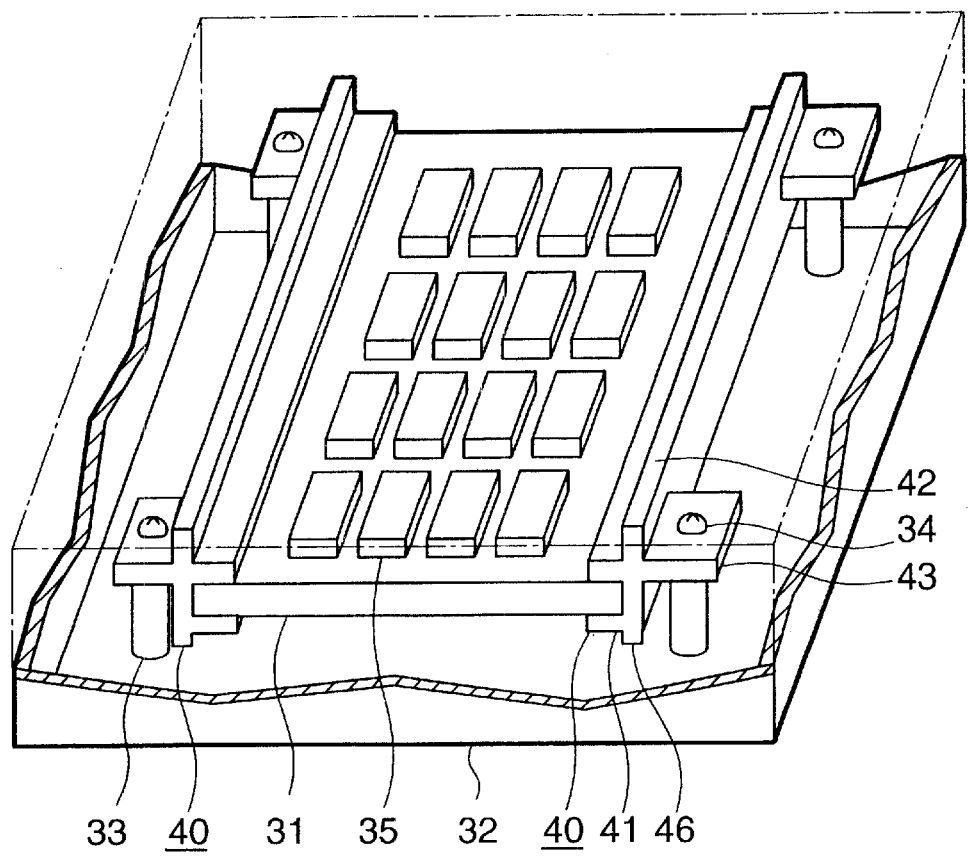
FIG. 3 is a perspective view of a second embodiment of this invention.
Figure 4:
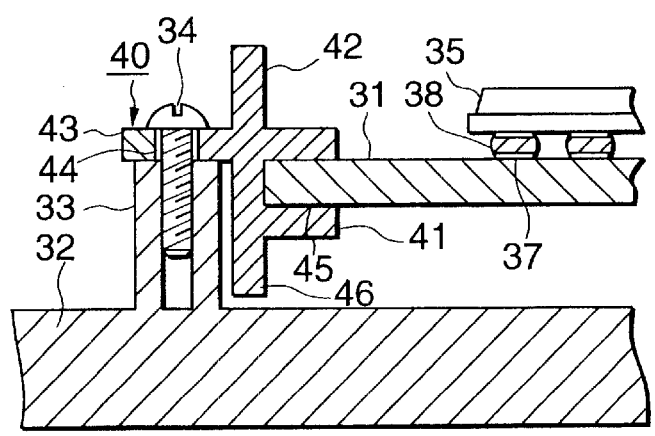
FIG. 4 is a cross sectional view of a main part of FIG. 3.

FIG. 3 is a perspective view showing a printed circuit board 31 mounted inside of a housing 32 through reinforcing members 40, and FIG. 4 is a cross sectional view showing the mounting portion mentioned above.

The second embodiment is almost similar to the first embodiment, and the only difference is that in the second embodiment, the reinforcing members 40 is provided with two ribs 42, 46. In other words, on the upper surface of the fitting portions 41 are integrally formed the ribs 42 so as to protrude upward in the longitudinal direction, and on the lower outer surface of the fitting portions 41 are integrally formed the ribs 46 so as to protrude downward in the longitudinal direction. Thus, the ribs 42, 46 are formed on both sides of the fitting portions 41 of the reinforcing members 40, so the second embodiment has an effect that larger flexure strength can be attained than the first embodiment in addition to the effect of the first embodiment.

In the second embodiment, the printed circuit board 31 is attached to the housing 32 in a similar way to the case of the first embodiment.

In the figures, reference numeral 33 denotes a support, 34 a screw, 35 an electronic component, 37 a land, 38 a solder bump, 43 a protrusion, 44 a through hole, and 45 a groove. These elements are similar to those of the first embodiment mentioned above.

Third Embodiment

Figure 5:
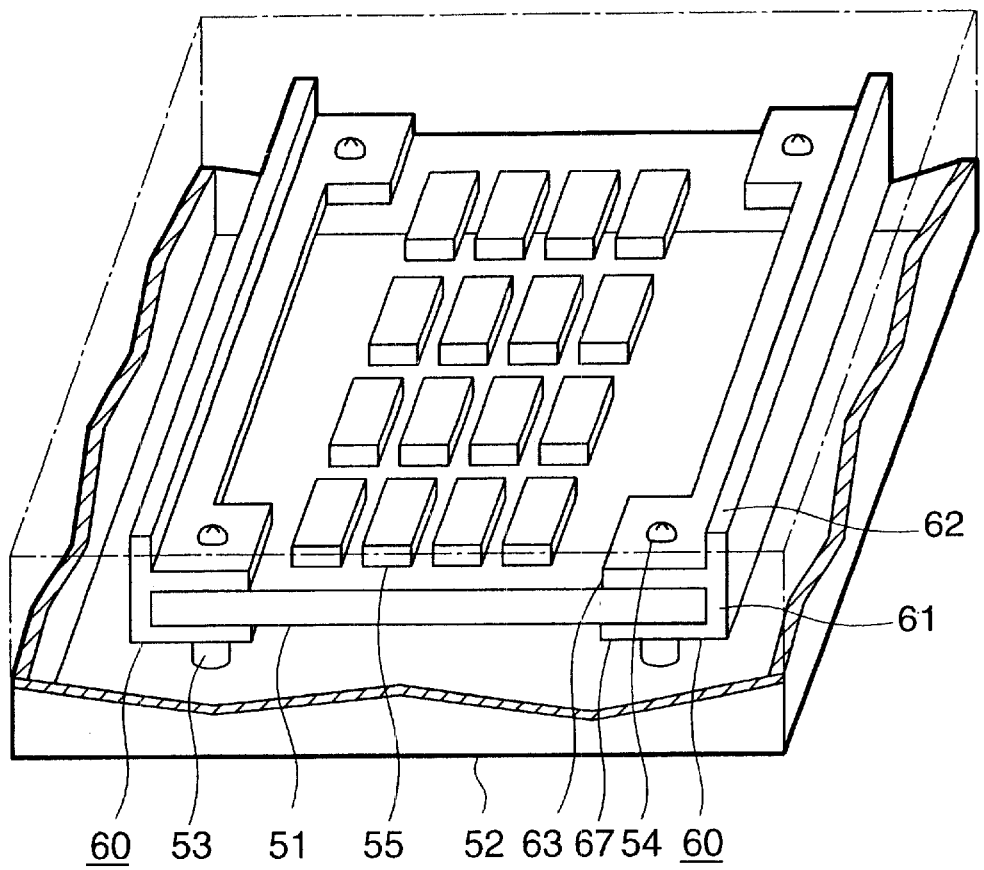
FIG. 5 is a perspective view of a third embodiment of this invention.
Figure 6:
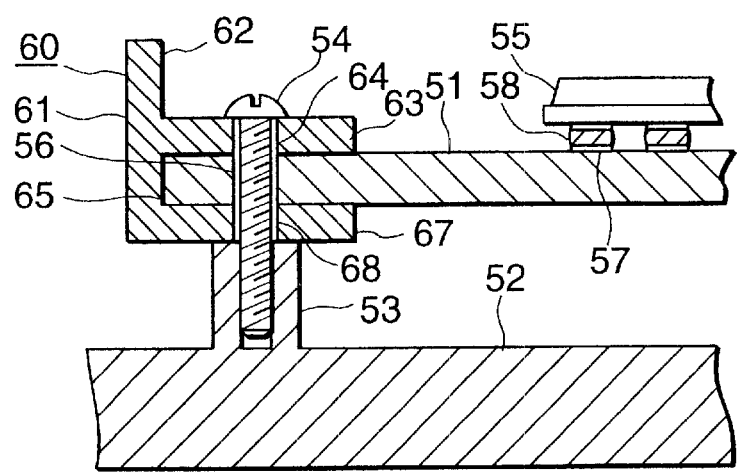
FIG. 6 is a cross sectional view of a main part of FIG. 5.

FIG. 5 is a perspective view showing a printed circuit board 51 mounted inside of a housing 52 through reinforcing members 60, and FIG. 6 is a cross sectional view showing the mounting portion.

The third embodiment is almost similar to the first embodiment, and the only differences is that the third embodiment, protrusions of the reinforcing members 60, that is, protrusions acting as a supporting plate for fixing by screw is formed on the same side as the groove. In other words, in the first embodiment mentioned early, the protrusions 23 having the through holes 24 for fixing by screw are formed so as to protrude from the outer faces opposite to the openings in the grooves 25 to the direction opposite to the grooves 25, while in the third embodiment, the protrusions are formed on the same side as the grooves 65, in which respect it is different from the first embodiment. Thus the protrusions, formed on the same side as the grooves 65, should be formed as a portion of the groove, so are formed divided into two portions, an upper protrusion 63 and a lower protrusion 67. Further, the protrusions act also as a supporting plate for fixing by screw. Therefore, in the upper protrusion 63 is formed a through hole 64 for passage of a screw, and in the lower protrusion 67 is formed a through hole 68 for passage of a screw. In the printed circuit board 51 through holes 56 are also formed corresponding to the through holes 64, 66.

In the third embodiment, the printed circuit board 51 is attached to the housing 52 by fitting the edges of the printed circuit board 51 into the respective grooves 65 of the reinforcing members 60 and aligning the through holes 64,68 in the protrusions 63, 67 of the reinforcing members 60 with corresponding through holes 56 in the printed circuit board 51, then aligning these through holes 64, 56, 68 with the threaded holes in the supports 53 situated at the corresponding positions of the housing 52 and fixing them by screws 54.

This third embodiment is constructed as mentioned above, so it has an effect that the printed circuit board can be disposed in the vicinity of the walls of the housing 52, therefore the size of the printed circuit board 51 can be made larger than in the case of the first embodiment because the portions to be fixed by screw are situated inside of the printed circuit board 51, in addition to the effect with the first embodiment mentioned above.

In the figures, reference numeral 53 denotes a support, 55 an electronic component, 57 a land, 58 a solder bump, 61 a fitting portion, and 62 a rib. These elements are similar to those of the First Embodiment mentioned above.

Fourth Embodiment

Figure 7:
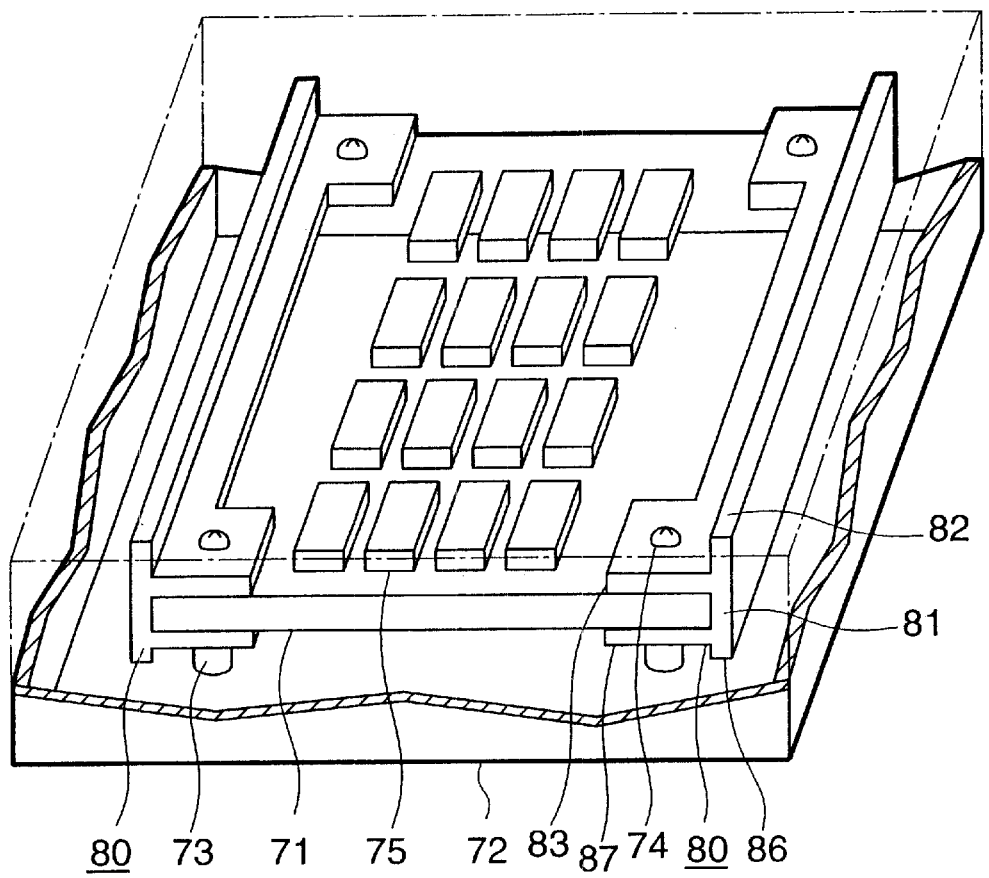
FIG. 7 is a perspective view of a fourth embodiment of this invention.
Figure 8:
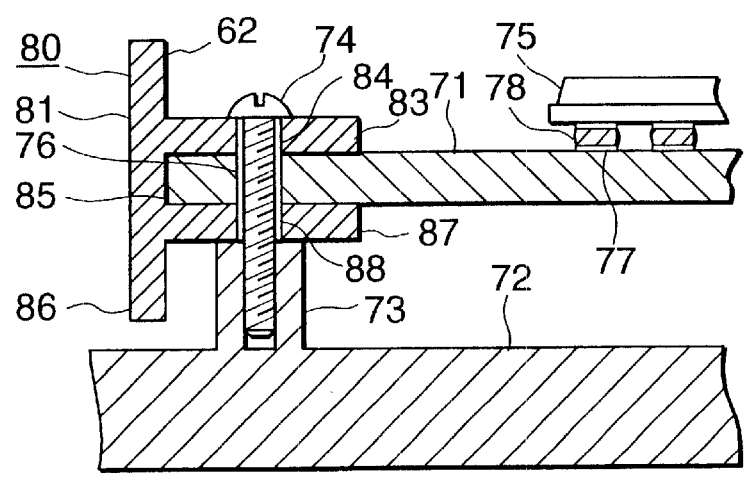
FIG. 8 is a cross sectional view of a main part of FIG. 7.

FIG. 7 is a perspective view showing a printed circuit board 71 mounted inside of a housing 72 through reinforcing members 80, and FIG. 8 is a cross sectional view showing the mounting portion.

The fourth embodiment is almost similar to the third embodiment, and the only difference is that in the fourth embodiment, the reinforcing members 80 are provided with two ribs 82, 86. In other words, on the upper outer surface of the fitting portions 81 the ribs 82 are integrally formed so as to protrude upward in the longitudinal direction, and on the lower outer surface of the fitting portions 81 the ribs 86 are integrally formed so as to protrude downward in the longitudinal direction. Thus, the ribs 82, 86 are formed on both sides of the fitting portions 81 of the reinforcing members 80, so the Forth Embodiment has an effect that larger flexure strength can be attained than the third embodiment in addition to the effect of the third embodiment.

In the fourth embodiment, the printed circuit board 71 is attached to the housing 72 in a similar way to the case of the third embodiment.

In the figures, reference numeral 73 denotes a support, 74 a screw, 75 an electronic component, 76 a through hole, 77 a land, 78 a solder bump, 83, 87 a protrusion, 84, 88 a through hole, and 85 a groove. These elements are similar to those of the First Embodiment mentioned above.

Fifth Embodiment

Figure 9:
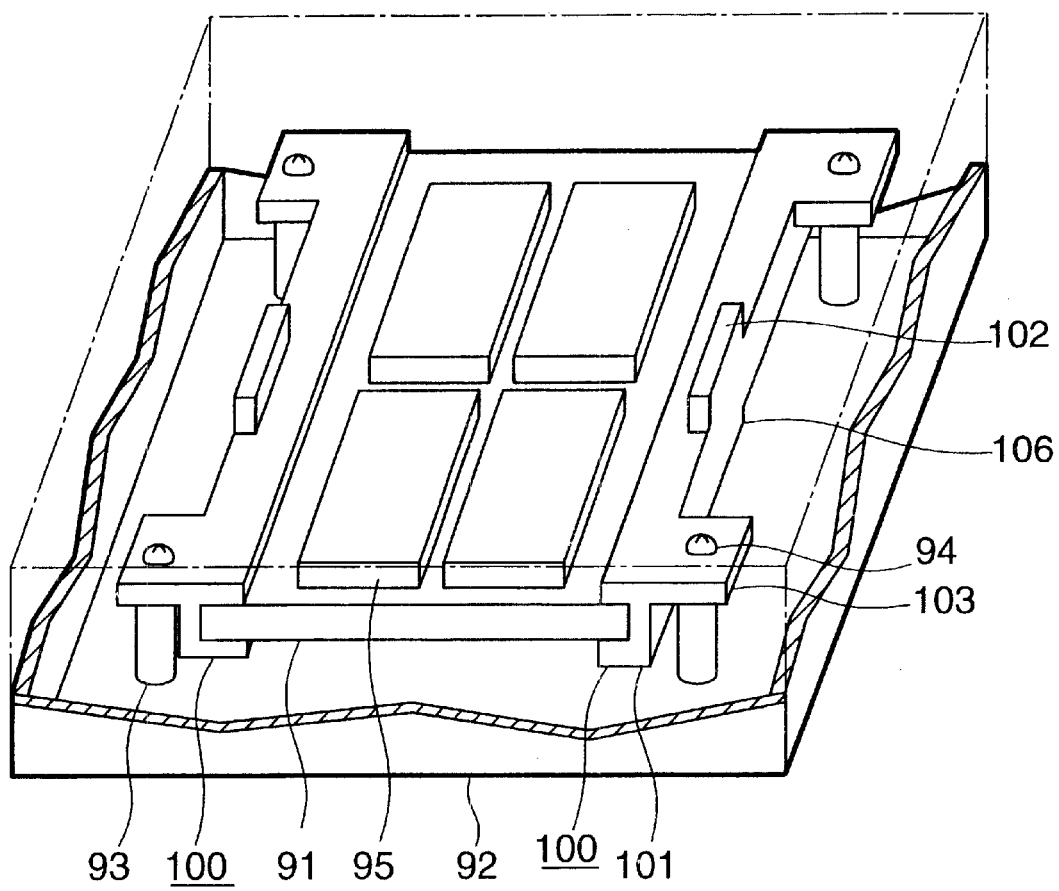
FIG. 9 is a perspective view of a fifth embodiment of this invention.

FIG. 9 is a perspective view showing a printed circuit board 91 mounted inside of a housing 92 through reinforcing members 100.

The fifth embodiment is almost similar to the second embodiment, and the only difference is that in the fifth embodiment, the length of the two ribs is shorter than that of the second embodiment. In other words, in the Second Embodiment, two ribs 42, 46 of the reinforcing members 40 are formed over the entire length of the reinforcing members 40, whereas in the Fifth Embodiment, two ribs 102, 106 of the reinforcing members 100 are formed only on sections where stress is expected to be concentrated in the longitudinal direction of the reinforcing member 100 (in the example shown, approximately central sections in the longitudinal direction).

The fifth embodiment is constructed in such a way, so has an effect that substantially the same effect can be obtained as the second embodiment with minimized weight of the reinforcing members 100.

In the figures, reference numeral 93 denotes a support, 94 a screw, 95 an electronic component, 101 a fitting portion, and 103 a protrusion. These elements are similar to those of the second embodiment mentioned above.

Further, a construction is described for the fifth embodiment in which ribs are formed only on sections where stress is expected to be concentrated, the same approach can be naturally applied to the first, third, or forth embodiment.

Sixth Embodiment

Figure 10:
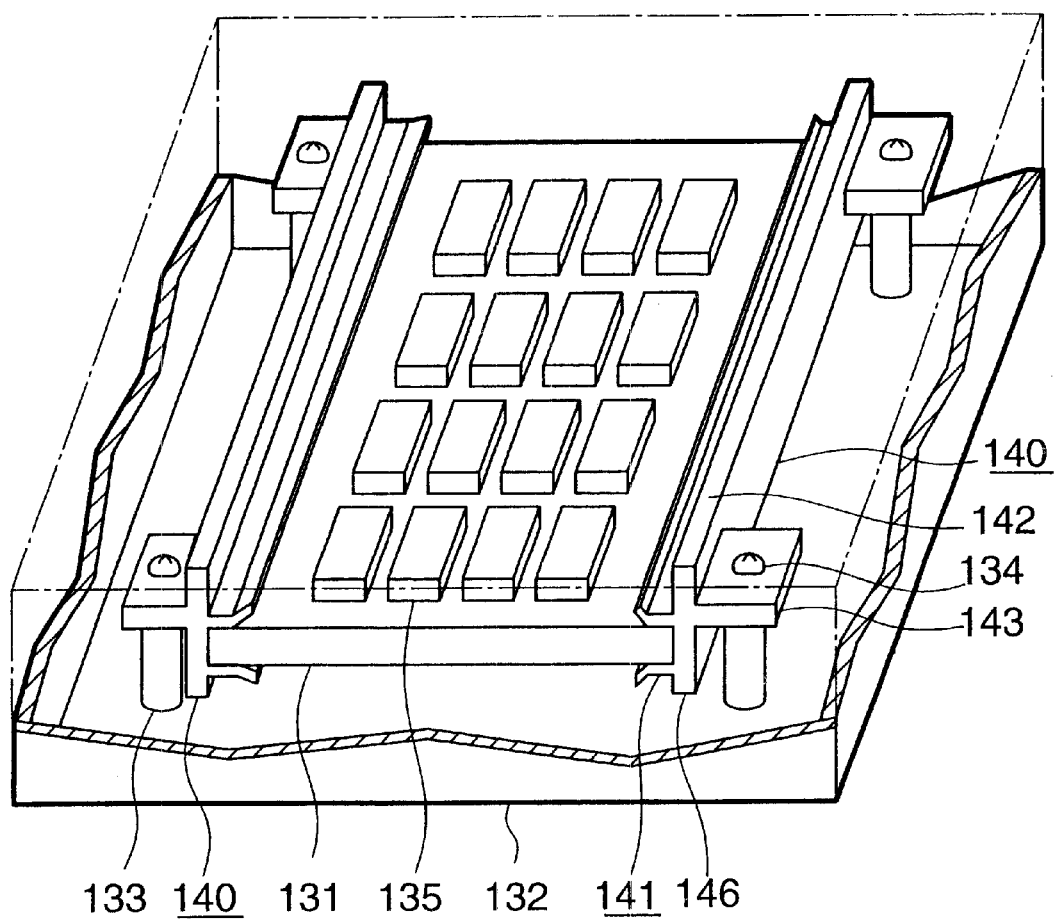
FIG. 10 is a perspective view of a sixth embodiment of this invention.
Figure 11:
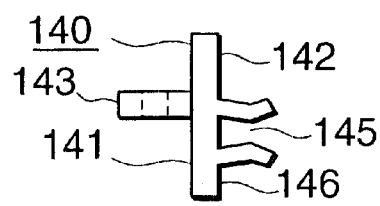
FIG. 11 is a side view of a piece of reinforcing members 140 of FIG. 10.
Figure 12:
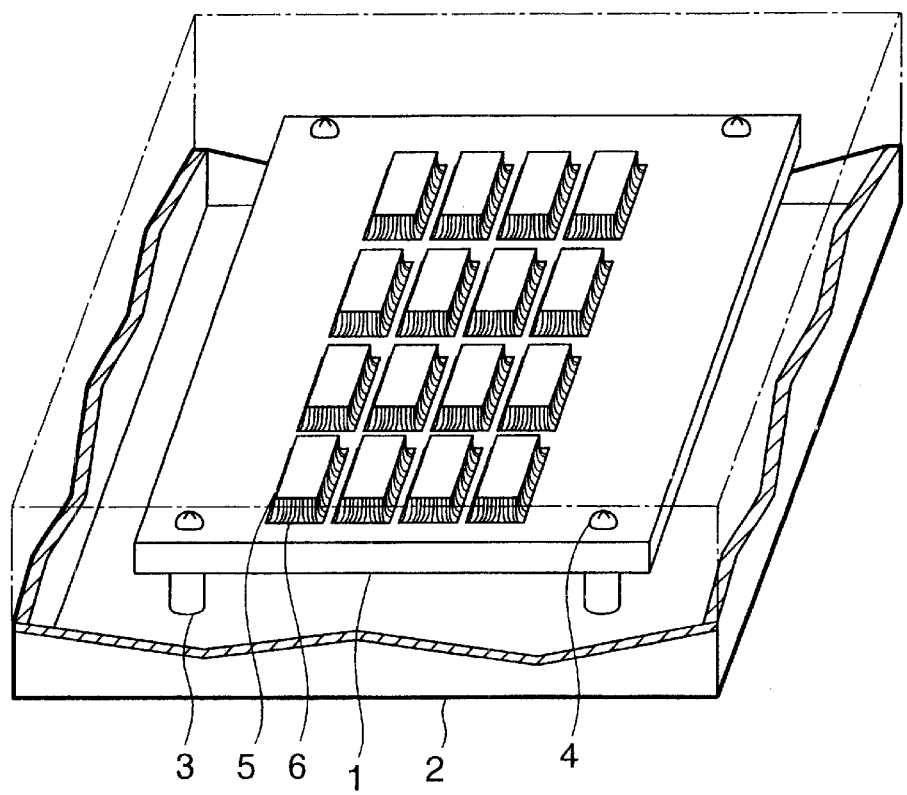
FIG. 12 is a perspective view of a conventional example.
Figure 13:
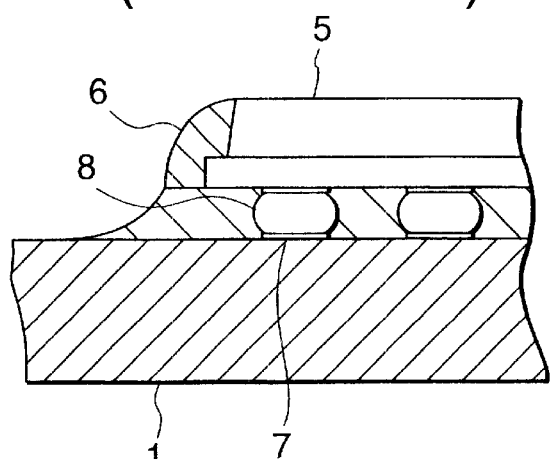
FIG. 13 is a cross sectional view of a bonded portion with thermosetting resin 6 of FIG. 12.

FIG. 10 is a perspective view showing a printed circuit board 131 mounted inside of a housing 132 through reinforcing members 140, and FIG. 11 is a side view of a reinforcing member 140 only.

The sixth embodiment is almost similar to the second embodiment, and the only difference is that in the sixth embodiment, the side walls constituting the grooves 145 in the reinforcing members 140 are formed so as to have elasticity. In other words, the side walls are formed so thin as to exhibit elasticity. In addition, the grooves 145 are so configured that their width is gradually decreased from the bottom surface of the grooves 145 toward the opening and then increased, and is about the same as that of the printed circuit board 131 near their bottom surface, and in its narrowest portion it is such that the printed circuit board 131 can be just inserted due to the elastic deformation of the side walls. Since the width near the bottom surface of the grooves 145 is about the same as that of the printed circuit board 131, and the ribs 142, 146 are formed in the outer portions (the portion toward the side wall of the housing 132) than the bottom surface of the grooves 145, the reinforcing effect of the ribs 142, 146 are not disturbed buy the elasticity. Thus, the side walls of the grooves 145 has elasticity, and its elasticity is so formed as not to disturb the reinforcing effect of the ribs 142, 146, the sixth embodiment has an effect that the operation to fit the edges of the printed circuit board 131 into the reinforcing members 140 can be performed easily and the workability can be attained, in addition to the effect of the second embodiment.

In the figures, reference numeral 133 denotes a support, 134 a screw, 135 an electronic component, 141 a fitting portion, and 143 a protrusion. These elements are similar to those of the Second Embodiment mentioned above.

Further, a construction is described for the sixth embodiment in which the side walls of the grooves have elasticity in the second embodiment, the same approach can be naturally applied to the first embodiment.

What is claimed is:

1. A structure for reinforcing a printed circuit board which is mounted with a plurality of electronic components and is placed within a housing having a plurality of supports each provided at predetermined positions inside the housing, comprising:
    a reinforcing member of an elongated shape attached to each of both edges of the printed circuit board, wherein the reinforcing member is integrally formed of plastic, and comprises:
        a groove portion into which the edge of the printed circuit board is to be fitted;
        a reinforcing rib which protrudes outwardly at a predetermined angle with respect to an opening direction of the groove portion and extends in a longitudinal direction of the reinforcing member; and
        a plurality of protrusions provided at positions, each of which corresponds to one of the supports of the housing to be fixed by means of a screw to a corresponding support so as to secure the reinforcing member to the housing.

2. The structure according to claim 1, wherein the reinforcing rib protrudes outwardly in a direction perpendicular to the opening direction of the groove portion.

3. The structure according to claim 1, wherein the protrusions are respectively provided on both ends of the reinforcing member in the longitudinal direction, wherein each of the protrusions protrudes in a direction opposite to the opening direction of the groove portion.

4. The structure according to claim 2, wherein the protrusions are respectively provided on both ends of the reinforcing member in the longitudinal direction, wherein each of the protrusions protrudes in a direction opposite to the opening direction of the groove portion.

5. The structure accordingly to claim 1, wherein the protrusions are respectively provided on both ends of the reinforcing member in the longitudinal direction, wherein each of the protrusions protrudes in the opening direction of the groove portion and is fixed to the corresponding support by means of a screw together with the edge of the printed circuit board fitted into the groove portion.

6. The structure according to claim 2, wherein the protrusions are respectively provided on both ends of the reinforcing member in the longitudinal direction, wherein each of the protrusions protrudes in the opening direction of the groove portion and is fixed to the corresponding support by means of screw together with the edge of the printed circuit board fitted into the groove portion.

7. The structure according to claim 2, wherein side walls of the groove portion are elastic and grasp the edge of the printed circuit board fitted into the groove portion by elasticity.

8. The structure according to claim 4, wherein side walls of the groove portion are elastic and grasp the edge of the printed circuit board fitted into the groove portion by elasticity.

9. The structure according to claim 1, wherein the electronic components are mounted on the printed circuit board with solder bumps.

10. The structure according to claim 1, wherein a through hole is formed in each of the protrusions and a threaded hole is formed in each of the supports of the housing, wherein each of the protrusions is screwed to the corresponding support to fix the reinforcing member to the housing.

11. The structure according to claim 5, wherein a through hole is formed in each of the protrusions and at a corresponding position of the printed circuit board and a threaded hole is formed in each of the supports of the housing, wherein each of the protrusions and the corresponding position of the printed circuit board are screwed to the corresponding support to fix the reinforcing member and the printed circuit board to the housing.

12. The structure according to claim 6, wherein a through hole is formed in each of the protrusions and at a corresponding position of the printed circuit board and a threaded hole is formed in each of the supports of the housing, wherein each of the protrusions and the corresponding position of the printed circuit board are screwed to the corresponding support to fix the reinforcing member and the printed circuit board to the housing.

13. An electronic apparatus comprising:
    a housing having a plurality of supports each provided at predetermined positions inside the housing;
    a printed circuit board mounted with a plurality of electronic components; and
    a reinforcing member of an elongated shape attached to each of both edges of the printed circuit board to reinforce the printed circuit board;
    wherein the reinforcing member is integrally formed of plastic, and comprises:
        a groove portion into which the edge of the printed circuit board is to be fitted;
        a reinforcing rib which protrudes outwardly at a predetermined angle with respect to an opening direction of the groove portion and extends in a longitudinal direction of the reinforcing member; and
        a plurality of protrusions provided at positions, each of which corresponds to one of the supports of the housing, wherein each of the protrusions is screwed to a corresponding support so as to secure the reinforcing member to the housing.

14. The electronic apparatus according to claim 13, wherein the reinforcing rib protrudes outwardly in a direction perpendicular to the opening direction of the groove portion.

* * * * *